(12) United States Patent
Simonsen

(10) Patent No.: US 11,471,910 B2
(45) Date of Patent: Oct. 18, 2022

(54) METHOD FOR COATING PARTS IN A DIP CENTRIFUGATION PROCESS

(71) Applicant: EJOT GmbH & Co. KG, Bad Berleburg (DE)

(72) Inventor: Fabian Simonsen, Erfurt (DE)

(73) Assignee: EJOT GmbH & Co. KG, Bad Berleburg (DE)

( * ) Notice: Subject to any disclaimer, the term of this patent is extended or adjusted under 35 U.S.C. 154(b) by 0 days.

(21) Appl. No.: 17/088,681

(22) Filed: Nov. 4, 2020

(65) Prior Publication Data

US 2021/0046501 A1 Feb. 18, 2021

Related U.S. Application Data

(63) Continuation of application No. PCT/EP2019/062191, filed on May 13, 2019.

(30) Foreign Application Priority Data

May 11, 2018 (DE) .................... 10 2018 111 331.5

(51) Int. Cl.
*B05D 1/18* (2006.01)
*B05C 3/08* (2006.01)
(Continued)

(52) U.S. Cl.
CPC .................. *B05C 3/08* (2013.01); *B05C 3/09* (2013.01); *B05D 1/005* (2013.01); *B05D 1/18* (2013.01); *G03F 7/162* (2013.01); *H01L 21/6715* (2013.01)

(58) Field of Classification Search
CPC ........... B05C 3/08; B05C 3/009; B05D 1/005; B05D 1/18; H01L 21/6715; G03F 7/162
(Continued)

(56) References Cited

U.S. PATENT DOCUMENTS 1,612,585 A * 12/1926 Jackson .................... C23C 2/14
427/241
3,310,027 A * 3/1967 Lindemann ............... B05C 3/10
118/52
(Continued)

FOREIGN PATENT DOCUMENTS

CN 203355993 12/2013
DE 913638 6/1954
(Continued)

OTHER PUBLICATIONS

International Search Report for International Application PCT/EP2019/062191, dated Aug. 26, 2019.
(Continued)

*Primary Examiner* — Brian K Talbot
(74) *Attorney, Agent, or Firm* — Burris Law, PLLC

(57) ABSTRACT

A coating method for coating parts in a dip-spin process is provided. The parts to be coated are dipped into a coating liquid and then centrifuged in at least one planetary basket arrangement in a planetary centrifuge. The planetary centrifuge includes a main rotor rotating about a main rotor axis of rotation and at least one planetary basket arrangement rotates about its planetary axis of rotation. Also, the planetary axis of rotation is arranged eccentrically on the main rotor. The at least one planetary basket arrangement can include a plurality of planetary baskets rotatably arranged about the planetary rotation axis of the at least one planetary basket arrangement and the planetary basket arrangement is rotated during a centrifuging operation.

17 Claims, 2 Drawing Sheets

Figure 1:
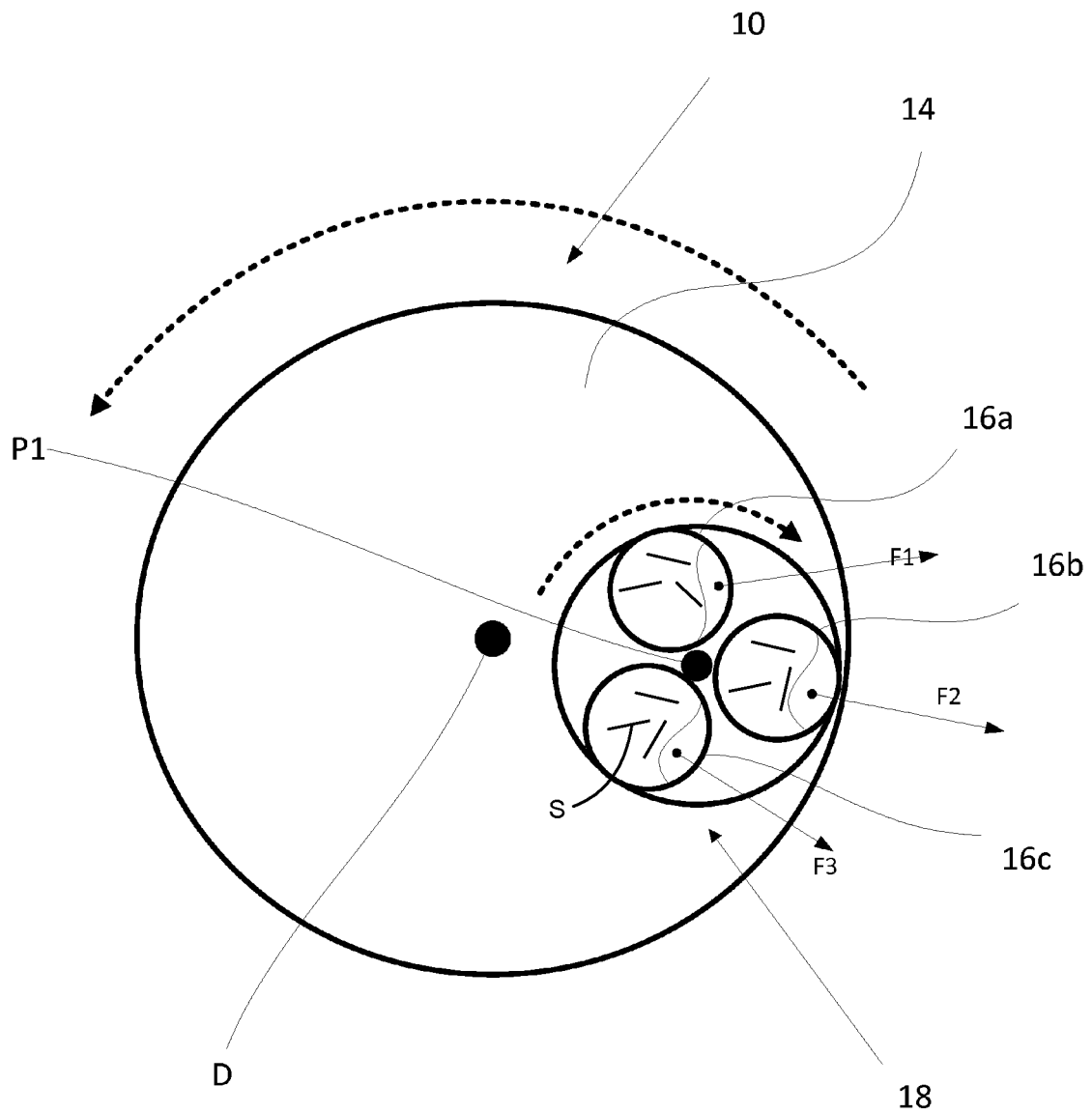

(51) Int. Cl.
 B05C 3/09 (2006.01)
 B05D 1/00 (2006.01)
 *G03F 7/16* (2006.01)
 *H01L 21/67* (2006.01)

(58) Field of Classification Search
 USPC .......................................................... 427/240
 See application file for complete search history.

(56) References Cited

U.S. PATENT DOCUMENTS

| | | | | |
|---|---|---|---|---|
| 3,699,918 | A * | 10/1972 | Garrison | B65G 49/0459 |
| | | | | 118/54 |
| 3,734,337 | A * | 5/1973 | Garrison | B65G 49/0459 |
| | | | | 220/533 |
| 4,148,942 | A * | 4/1979 | Gierek | C23C 2/14 |
| | | | | 118/52 |
| 5,458,917 | A * | 10/1995 | Motohashi | B65G 49/045 |
| | | | | 118/409 |
| 6,837,933 | B2 * | 1/2005 | Reinhardt | B05C 3/08 |
| | | | | 118/418 |
| 7,198,674 | B2 * | 4/2007 | Schaeuble | B05C 3/08 |
| | | | | 118/52 |
| 7,335,392 | B2 * | 2/2008 | Yoshimura | H01F 41/026 |
| | | | | 427/127 |
| 2007/0134412 | A1 * | 6/2007 | Havens | B05C 3/08 |
| | | | | 427/430.1 |
| 2008/0102199 | A1 * | 5/2008 | Gurary | C23C 16/4584 |
| | | | | 427/240 |
| 2017/0134412 | A1 * | 5/2017 | Cheng | H04L 67/2842 |
| 2019/0060945 | A1 * | 2/2019 | Forster | B05C 3/02 |
| 2022/0072583 | A1 * | 3/2022 | Simonsen | C23C 24/04 |

FOREIGN PATENT DOCUMENTS

| | | |
|---|---|---|
| DE | 19613927 | * 11/1997 |
| DE | 29911753 | 11/2000 |
| DE | 10344475 | 1/2005 |
| EP | 0336983 | 10/1989 |
| TW | M463614 | 10/2013 |

OTHER PUBLICATIONS

Office Action issued in Indian Patent Application No. 202047053324, dated Sep. 30, 2021.

* cited by examiner

METHOD FOR COATING PARTS IN A DIP CENTRIFUGATION PROCESS

CROSS-REFERENCE TO RELATED APPLICATIONS

This application is a continuation of International Application No. PCT/EP2019/062191, filed on May 13, 2019, which claims priority to and the benefit of DE 10 2018 111 331.5, filed on May 11, 2018. The disclosures of the above applications are incorporated herein by reference.

FIELD

The present disclosure relates to a method for coating parts in a dip-spin process and particularly for coating screws or other bulk material in a dip-spin process.

BACKGROUND

The statements in this section merely provide background information related to the present disclosure and may not constitute prior art.

Coating parts in a dip-spin process includes filling a basket assembly with a bulk material and dipping the bulk material into a coating agent. The basket assembly is then centrifuged in a planetary centrifuge such that the basket assembly having a basket is rotated about a planetary axis of rotation concentric to the basket assembly. And sometimes a plurality of baskets are rotated around their planetary axes of rotation. The basket rotation axis is eccentrically arranged on the rotor of a centrifuge and is equally distributed on a circumference around the main rotor axis. Such an arrangement is known from DE 299 11 753 U1, for example.

For an economically reasonable throughput, a relatively large amount of bulk material must be filled into the basket arrangement. However, when larger amounts of bulk material are filled in the basket arrangement, and given the speeds needed for effective centrifugation of the coating liquid, the bulk material accumulates in an area of the planetary basket arrangement due to the centrifugal forces where it no longer permits significant relative movement between the parts due to the high friction.

The parts deposited in this way on the planetary basket arrangement generate a high counter-torque so that a free rotation of the planetary basket against the main axis of rotation is inhibited. As a result, mixing and change of position of the individual elements of the bulk material does not desirably take place and thus the coating agent is not reliably thrown out of small scooping structures of the bulk material.

SUMMARY

This section provides a general summary of the disclosure and is not a comprehensive disclosure of its full scope or all of its features.

The present disclosure provides a method for coating components which have scooping structures (e.g., small scooping structures).

In some variations of the present disclosure, the components to be coated are screws, for example, small crews from which a coating agent on or in internal drives of the small screws is not typically and completely flung off during centrifuging.

A coating method includes a planetary basket arrangement that is filled with bulk material (e.g., small screws) and dipped into a coating agent. In order to ensure the necessary mixing, the planetary basket arrangement is only be partially filled with the bulk material, leaving the remaining volume free. The bulk material in the planetary basket arrangement is then subjected to a centrifuging process in a planetary centrifuge, which has a main rotor rotating around a main rotor axis. The centrifuging process takes place such that during the rotation of the main rotor the at least one planetary basket arrangement rotates about its planetary rotation axis, wherein the planetary rotation axis is arranged eccentrically on the main rotor, i.e. radially spaced from the main rotor axis.

According to one form of the present disclosure, a planetary centrifuge is used which has a planetary basket arrangement comprising a plurality of planetary baskets which are arranged, for example symmetrically, so as to be rotatable about the axis of rotation of the planetary basket arrangement.

In some variations, the planetary basket arrangement includes an odd number of planetary baskets. Due to the odd number of planetary baskets, each planetary basket generates different torques around the planetary axis of rotation, and the different torques act in different directions of rotation during rotation.

The different torques reduce the torque acting around the planetary rotation axis against the direction of rotation—i.e., a restoring torque—and allows the planetary basket arrangement to rotate through a large angle of rotation which is not limited by the restoring torque.

This allows the rotation of the planetary baskets around the planetary rotation axis during centrifugation to achieve a large angle of rotation, in particular more than 360°. In this way, the individual elements undergo a continuous change of position, which ensures a reliable centrifugation of the coating agent contained in the small scooping structures.

The direction of rotation around the at least one planetary rotation axis is in particular opposite to the direction of rotation of the main rotor axis of rotation.

The number of planetary baskets can be odd. For example, in one variation of the present disclosure three planetary baskets are provided. In some variations, the planetary baskets have a circular cross section and lie with their side walls adjacent to each other. In some variations, planetary baskets are in contact with each other. Also, in at least one variation the planetary rotation axis is located in a center of a line or an area formed or defined by connecting centers of the planetary baskets with each other. For example, in variations there are two planetary baskets, the planetary rotation axis is a center of line between the centers of the two planetary baskets. And in variations where there are three planetary baskets, the planetary rotation axis is located in a center of an area (triangle) defined by lines connecting the centers of the three planetary baskets. Accordingly, in variations where there are four planetary baskets, the planetary rotation axis is located in a center of an area (rectangle) defined by lines connecting the centers of the four planetary baskets.

In some variations, the planetary baskets are filled with an equal mass of the bulk material such that a continuous reduction of the counter-torque acting against the direction of rotation of the planetary rotation axis is established.

In at least one variation, the coating agent is a liquid zinc flake coating, while in other variations the coating agent is an aluminum flake coating. However, it should be understood that other coating agents are included within the teachings of the present disclosure.

In some variations, the centrifuge has several (plurality of) planetary axes of rotation, around each of which a planetary basket arrangement is rotatably mounted. The planetary basket arrangement has a radius of a circle enclosing the planetary baskets, the radius of which is smaller than the distance between the planetary rotation axis and the main rotor axis. In some variations, the distance between the planetary rotation axis and the main rotor axis corresponds approximately to the radius of the circle enclosing the planetary baskets.

In some variations, the speed for the main rotor is between 120 revolutions per minute (rpm) rpm and 450 rpm and the speed for the planetary basket arrangement is between 0.5 rpm and 5 rpm. In such variations a mixing, in particular a change of position of coated components during centrifugation is provided.

In at least one variation, the distance of the planet rotation axis from the main rotor axis is preferably between 0.2 meters (m) and 1 m.

Further advantages, features and possible applications result from the following description in connection with the forms or variations shown in the drawings. Also, further areas of applicability will become apparent from the description provided herein. It should be understood that the description and specific examples are intended for purposes of illustration only and are not intended to limit the scope of the present disclosure.

DRAWINGS

Figure 2:
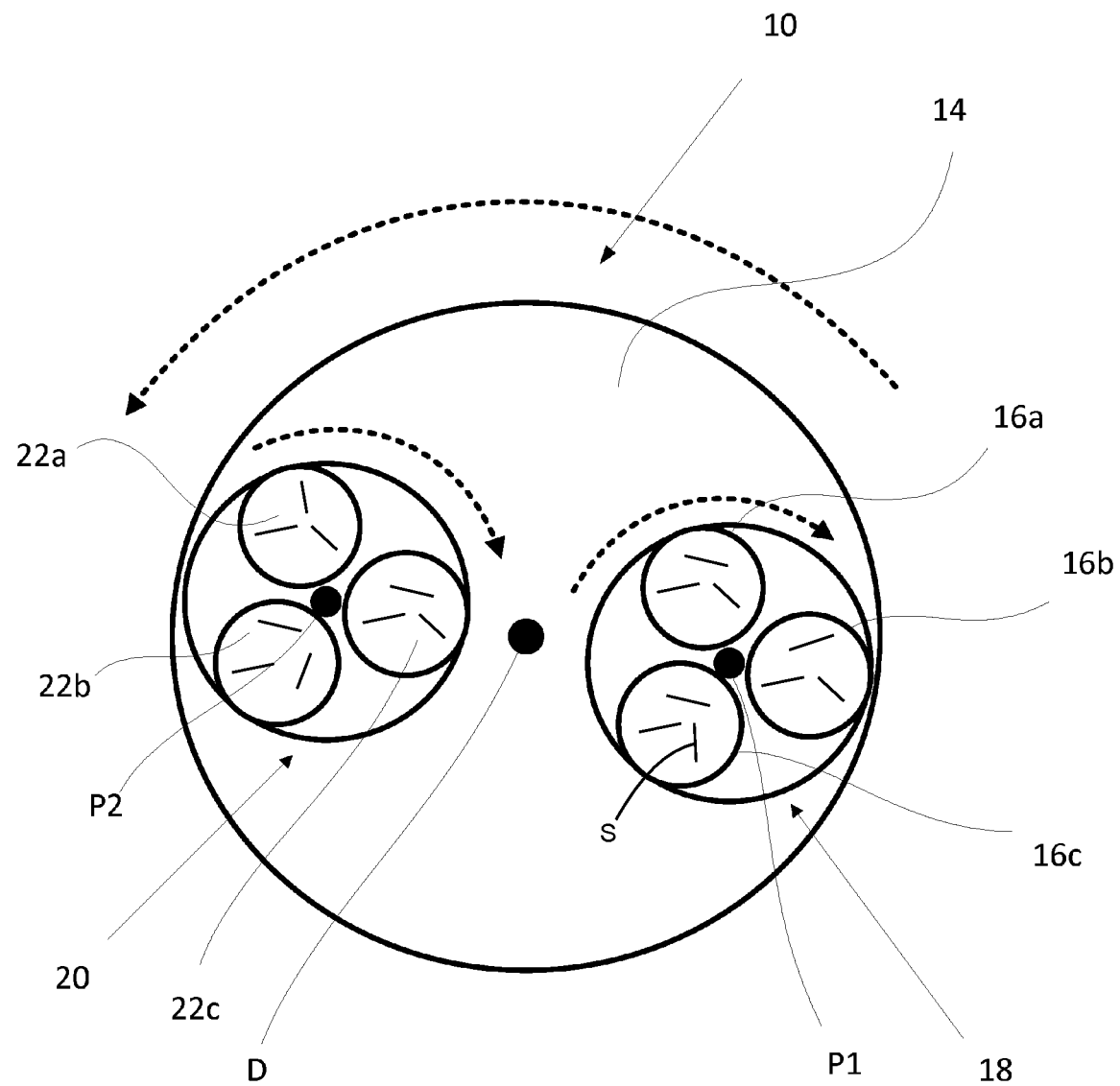

In order that the disclosure may be well understood, there will now be described various forms thereof, given by way of example, reference being made to the accompanying drawings, in which:

FIG. 1 shows a device used for spinning off excess coating liquid in a coating method according to one form of the present disclosure, and FIG. 2 shows a device used to spin off excess coating liquid with two planetary basket arrangements in a coating method according to another form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows a planetary centrifuge 10 with a main axis of rotation D, around which a main rotor 14 can rotate in a first direction of rotation. Eccentrically on the main rotor 14 a planetary basket arrangement 18 is provided, which rotates around its planetary rotation axis P1. According to the present disclosure, the planetary basket arrangement 18 in one form comprises three planetary baskets 16a, 16b, 16c, wherein all three planetary baskets 16a, 16b, 16c are filled with the same or approximately the same quantity of parts to be coated.

In some variations of the present disclosure, the direction of rotation of the main rotor 14 is counterclockwise as shown in FIG. 1, whereas the direction of rotation of the planetary basket arrangement 18 is clockwise.

In one non-limiting example, the speed of the main rotor is 300 rpm and the speed of the planetary basket arrangement 18 is about 1 rpm.

Thus, in a snapshot taken during centrifugation, the forces F1, F2, F3 result from the parts distributed in the planetary baskets 16a, 16b, 16c. The forces F2, F3 generate a moment against the direction of rotation, whereas F1 generates a moment in the direction of rotation. This reduces the load on the drive motor for rotating of the planetary basket arrangement 18, so that a rotation of the planetary basket arrangement 18 over 360° is possible and put into effect, which leads to a mixing and change of position of the parts to be coated. The walls of the planetary baskets 16a, 16b, 16c are designed such that the coating liquid can be drained off during centrifugation. In particular, in some variations they are designed as grid baskets. The method according to the teachings of the present disclosure provides the coating liquid to be reliably centrifuged from the smallest of scooping structures such as the threads, the head and/or the drive of the head of screws 'S' (e.g., small screws). This has the advantage, in particular with small screw drives, that excess coating in the drive of the screws S does not counteract receiving of a drive bit (e.g., a blade of a screwdriver).

FIG. 2 shows another schematic view of a planetary centrifuge as it is used in the coating method according to the teachings of the present disclosure. In addition to the arrangement described in FIG. 1, the planetary centrifuge 10 has a second planetary basket arrangement 20 with three planetary baskets 22a, 22b, 22c, which are rotated around their axis of rotation P2. As shown in FIG. 2, in some variations the second planetary basket arrangement 20 rotates in the same direction as the first planetary basket arrangement 18. Also, it should be understood that walls of the three planetary baskets 22a, 22b, 22c are designed such that the coating liquid can be drained off during centrifugation similarly as discussed above with respect to three planetary baskets 16a, 16b, 16c. In particular, in some variations they are designed as grid baskets. In addition the second planetary basket arrangement 20 provides the coating liquid to be reliably centrifuged from the smallest of scooping structures such as the threads, the head and/or the drive of the head of screws S. Thus, the throughput of parts to be processed in one coating process ban be increased.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for coating parts in a dip-spin process, the method comprising:
   dipping parts to be coated into a coating liquid and coating the parts; and centrifuging the coated parts in at least one planetary basket arrangement in a planetary centrifuge, the planetary centrifuge comprising a main rotor rotating about a main rotor axis of rotation during the centrifuging and the at least one planetary basket arrangement comprising a plurality of planetary baskets rotatably arranged about a planetary axis of rotation of the at least one planetary basket arrangement during the centrifuging, wherein the planetary axis of rotation is arranged on the main rotor eccentrically to the main rotor axis of rotation and the at least one planetary basket arrangement is rotated during the centrifuging, wherein the plurality of planetary baskets each have a circular cross section and the planetary basket arrangement has a radius of a circle enclosing the plurality of planetary baskets, and wherein the radius of the circle is smaller than a distance between the planetary axis of rotation and the main rotor axis of rotation.

2. The method according to claim 1, wherein the at least one planetary basket arrangement comprises an odd number of planetary baskets.

3. The method according to claim 1, wherein the at least one planetary basket arrangement comprises a plurality of planetary basket arrangements.

4. The method according to claim 3, wherein each of the planetary basket arrangements comprises an odd number of planetary baskets.

5. The method according to claim 2, the odd number of planetary baskets is three planetary baskets.

6. The method according to claim 1, wherein the main rotor is rotated around the main rotor axis of rotation with a speed between 120 rpm and 450 rpm.

7. The method according to claim 1, wherein the at least one planetary basket arrangement is rotated around the planetary axis of rotation with a speed between 0.5 rpm and 5 rpm.

8. The method according to claim 1, wherein the at least one planetary basket arrangement is rotated by more than 360° about the planetary axis of rotation axis during the centrifuging.

9. A method for coating parts in a dip-spin process, the method comprising:

dipping screws into a coating liquid and coating the screws, wherein each of the screws comprises at least one scooping structure; and centrifuging the coated screws in at least one planetary basket arrangement in a planetary centrifuge, the planetary centrifuge comprising a main rotor rotating about a main rotor axis of rotation during the centrifuging and the at least one planetary basket arrangement comprising an odd number of planetary baskets rotatably arranged about a planetary axis of rotation of the at least one planetary basket arrangement during the centrifuging, wherein the planetary axis of rotation is arranged on the main rotor eccentrically to the main rotor axis of rotation and the at least one planetary basket arrangement is rotated during the centrifuging, and the coating liquid is removed from the at least one scooping structure of during centrifuging wherein the plurality of planetary baskets each have a circular cross section and the planetary basket arrangement has a radius of a circle enclosing the plurality of planetary baskets, and wherein the radius of the circle is smaller than a distance between the planetary axis of rotation and the main rotor axis of rotation.

10. The method according to claim 9, wherein the at least one planetary basket arrangement comprises an odd number of planetary baskets.

11. The method according to claim 9, wherein the at least one planetary basket arrangement comprises a plurality of planetary basket arrangements.

12. The method according to claim 11, wherein each of the plurality of planetary basket arrangements comprises three planetary baskets.

13. The method according to claim 9, wherein the main rotor is rotated around the main axis of rotation with a speed between 120 rpm and 450 rpm.

14. The method according to claim 9, wherein the at least one planetary basket arrangement is rotated around the planetary axis of rotation with a speed between 0.5 rpm and 5 rpm.

15. The method according to claim 9, wherein the at least one planetary basket arrangement is rotated by more than 360° about the planetary rotation axis during the centrifuging.

16. The method according to claim 1, wherein the main rotor and the at least one planetary basket arrangement are rotated independently.

17. The method according to claim 1, wherein the main rotor and the at least one planetary basket arrangement are rotated in opposite rotational directions.

* * * * *